(12) United States Patent
Bando et al.

(10) Patent No.: US 10,950,764 B2
(45) Date of Patent: Mar. 16, 2021

(54) LIGHT-EMITTING DEVICE

(71) Applicant: NICHIA CORPORATION, Anan (JP)

(72) Inventors: Atsushi Bando, Itano-gun (JP); Kazuya Matsuda, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/200,635

(22) Filed: Nov. 26, 2018

(65) Prior Publication Data

US 2019/0165222 A1 May 30, 2019

(30) Foreign Application Priority Data

Nov. 28, 2017 (JP) .............................. JP2017-227346
Oct. 12, 2018 (JP) .............................. JP2018-193652

(51) Int. Cl.
*H01L 25/075* (2006.01)
*H01L 33/54* (2010.01)
(Continued)

(52) U.S. Cl.
CPC .......... *H01L 33/54* (2013.01); *H01L 25/0753* (2013.01); *H01L 25/167* (2013.01);
(Continued)

(58) Field of Classification Search
CPC ..... H01L 33/54; H01L 33/502; H01L 33/647; H01L 33/50–508; H01L 33/62; H01L 33/58–60; H01L 33/56; H01L 33/486; H01L 27/0248; H01L 25/167; H01L 25/0753; H01L 2933/0091; H01L 2933/0041; H01L 2933/0058; H01L 2933/0083; H01L 33/44; H01L 33/48; H01L 33/52; H01L 2933/005; H01L 27/156; H05B 33/0845; H05B 33/0827
(Continued)

(56) References Cited

U.S. PATENT DOCUMENTS 7,446,343 B2 * 11/2008 Mueller .................. C04B 35/01
257/88
2008/0023712 A1 1/2008 Mueller et al.
(Continued)

FOREIGN PATENT DOCUMENTS

JP 2007-214579 A 8/2007
JP 2008-084967 A 4/2008
(Continued)

*Primary Examiner* — Natalia A Gondarenko
(74) *Attorney, Agent, or Firm* — Foley & Lardner LLP

(57) ABSTRACT

A light-emitting device includes: a first light-emitting element and a second light-emitting element, each having a peak emission wavelength in a range of 430 nm to 480 nm; and a sealing member covering the first light-emitting element and the second light-emitting element, the sealing member containing a first fluorescent material. The first light-emitting element and the second light-emitting element are configured to be individually driven. The sealing member includes a protruding portion at an upper surface thereof. The first light-emitting element is disposed in a first region, which is located under the protruding portion. The second light-emitting element is disposed in a second region, which is located under the upper surface of the sealing member at a position different from the first region.

18 Claims, 7 Drawing Sheets

(51) Int. Cl.
*H01L 33/48* (2010.01)
*H01L 33/50* (2010.01)
*H01L 33/56* (2010.01)
*H01L 33/60* (2010.01)
*H01L 33/62* (2010.01)
*H01L 33/64* (2010.01)
*H01L 25/16* (2006.01)
*H01L 27/02* (2006.01)

(52) U.S. Cl.
CPC ........ *H01L 27/0248* (2013.01); *H01L 33/486* (2013.01); *H01L 33/502* (2013.01); *H01L 33/56* (2013.01); *H01L 33/60* (2013.01); *H01L 33/62* (2013.01); *H01L 33/647* (2013.01); *H01L 2933/0091* (2013.01)

(58) Field of Classification Search
USPC ............... 257/89, 98, 99, E33.056, E33.061, 257/E33.059; 438/27
See application file for complete search history.

(56) References Cited

U.S. PATENT DOCUMENTS

| | | | |
|---|---|---|---|
| 2009/0212305 A1 | 8/2009 | Harada | |
| 2010/0110659 A1 | 5/2010 | Nakajima | |
| 2010/0134043 A1 | 6/2010 | Kadotani et al. | |
| 2010/0219428 A1* | 9/2010 | Jung | H01L 25/0753 257/89 |
| 2011/0300644 A1 | 12/2011 | Akimoto et al. | |
| 2012/0044667 A1* | 2/2012 | Hanawa | H01L 33/46 362/97.1 |
| 2012/0286304 A1* | 11/2012 | LeToquin | H05B 33/14 257/89 |
| 2013/0001599 A1 | 1/2013 | Lee | |
| 2013/0168709 A1* | 7/2013 | Lin | H01L 25/0753 257/89 |
| 2013/0207141 A1* | 8/2013 | Reiherzer | H01L 33/505 257/98 |
| 2013/0248896 A1 | 9/2013 | Lee | |
| 2015/0008464 A1 | 1/2015 | Iwakura | |
| 2015/0036114 A1* | 2/2015 | Schadt | H01L 25/0753 355/67 |
| 2015/0054005 A1* | 2/2015 | Kim | H01L 33/58 257/89 |
| 2016/0005723 A1 | 1/2016 | Lee | |
| 2017/0040307 A1 | 2/2017 | Lee | |
| 2017/0196060 A1 | 7/2017 | Watanabe et al. | |
| 2017/0236982 A1 | 8/2017 | Akiyama et al. | |
| 2017/0288111 A1 | 10/2017 | Lee | |
| 2019/0109267 A1 | 4/2019 | Lee | |

FOREIGN PATENT DOCUMENTS

| | | |
|---|---|---|
| JP | 2008-085026 A | 4/2008 |
| JP | 2009-206246 A | 9/2009 |
| JP | 2010-109170 A | 5/2010 |
| JP | 2010-129583 A | 6/2010 |
| JP | 2010-147318 A | 7/2010 |
| JP | 2010-182724 A | 8/2010 |
| JP | 2012-019201 A | 1/2012 |
| JP | 2013-120812 A | 6/2013 |
| JP | 2015-015371 A | 1/2015 |
| JP | 2016-167642 A | 9/2016 |
| JP | 2017-120897 A | 7/2017 |
| JP | 2017-135130 A | 8/2017 |
| JP | 2017-152566 A | 8/2017 |
| KR | 20140028794 A | 3/2014 |
| WO | WO-2016/052550 A1 | 4/2016 |

\* cited by examiner

LIGHT-EMITTING DEVICE

CROSS-REFERENCE TO RELATED APPLICATION

This application claims priority to Japanese Patent Application No. 2017-227346, filed on Nov. 28, 2017, and Japanese Patent Application No. 2018-193652, filed on Oct. 12, 2018, the disclosures of which are hereby incorporated by reference in their entireties.

BACKGROUND

The present disclosure relates to a light-emitting device.

Generally, light-emitting devices including light-emitting elements such as light-emitting diodes are widely used for light sources in various types of apparatuses such as illumination devices. An example of such a light-emitting device is described in, for example, Japanese Patent Publication No. 2013-120812. This light-emitting device in Japanese Patent Publication No. 2013-120812 includes a plurality of light-emitting elements, a fluorescent material, and a package to individually supply current to each of the light-emitting elements. In such a light-emitting device, adjustment of light-emission intensity of each of the light-emitting elements allows the light-emitting device to have a desired emission color.

SUMMARY

However, it is difficult for the light-emitting device described in Japanese Patent Publication No. 2013-120812 to emit light having colors in a wide chromaticity range.

It is an object of certain embodiments of the present disclosure to provide a light-emitting device configured to emit light with a color in a wide chromaticity range.

According to one embodiment of the present invention, a light-emitting device includes: a first light-emitting element and a second light-emitting element each having a peak emission wavelength in a range of 430 nm to 480 nm; and a sealing member covering the first light-emitting element and the second light-emitting element, the sealing member containing a first fluorescent material. The first light-emitting element and the second light-emitting element are configured to be individually driven. The sealing member includes a protruding portion at an upper surface thereof. The first light-emitting element is disposed in a first region, which is a region under the protruding portion, and the second light-emitting element is disposed in a second region, which is a region under the upper surface of the sealing member and is located at a position different from the first region.

According to another embodiment of the present invention, a light-emitting device includes: a first light-emitting element and a second light-emitting element each having a peak emission wavelength in a range of 430 nm to 480 nm; and a sealing member covering the first light-emitting element and the second light-emitting element, the sealing member containing a first fluorescent material. The first light-emitting element and the second light-emitting element are configured to be individually driven. The sealing member includes a depressed portion recessed downward at a portion of an upper surface thereof. The second light-emitting element is located in a first region, which is a region under the depressed portion. The first light-emitting element is disposed in a second region, which is a region under the upper surface of the sealing member and is located at a position different from the first region.

According to certain embodiments of the present invention, the light-emitting device configured to emit light having a color in a wide chromaticity range.

DETAILED DESCRIPTION OF EMBODIMENTS

Figure 1A:
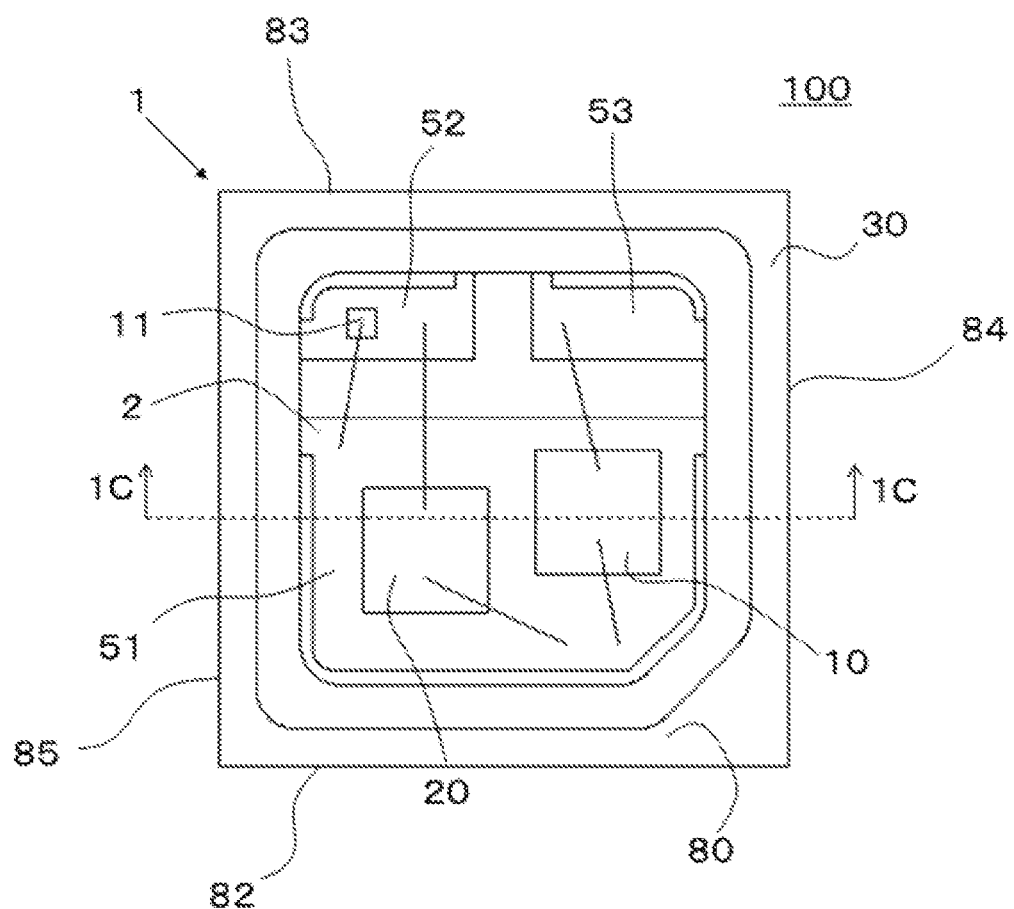
FIG. 1A is a schematic top view of a light-emitting device according to a first embodiment.

Detailed description will be given with reference to the accompanying drawings. The same reference numeral in multiple drawings denotes the same or equivalent portions or members.

In the following description, examples of light-emitting devices are described to give a concrete form to the technical ideas of the present invention. However, the present invention is not limited to the examples described below. Unless otherwise specified, dimensions, materials, shapes, relative arrangements, etc., of constituent components are not intended to limit the scope of the present invention but are described as examples. In the description below, terms indicative of specific directions or positions (such as "upper", "lower", and other terms including the aforementioned terms) may be occasionally used. These terms are used to facilitate understanding of relative directions or positions in the referenced drawings. Sizes, positional relationships, or the like of components illustrated in the drawings may be exaggerated so as to facilitate understanding. Relationships between color names and chromaticity coordinates and relationships between wavelength ranges of light and color names of monochromatic lights are based on Japanese Industrial Standard (JIS) Z8110.

In the present specification and accompanying drawings, an "X-direction" indicates lateral directions including both a rightward direction (i.e., +X direction) and a leftward direction (i.e., −X direction) in the drawings. Further, a "Y-direction" indicates upper-lower directions including both an upward direction (i.e., +Y direction) and a downward direction (i.e., −Y direction) in the drawings.

In the description of embodiments below, terms such as "package" may be used both before and after providing light-emitting elements, wires, and other components.

First Embodiment

Figure 1B:
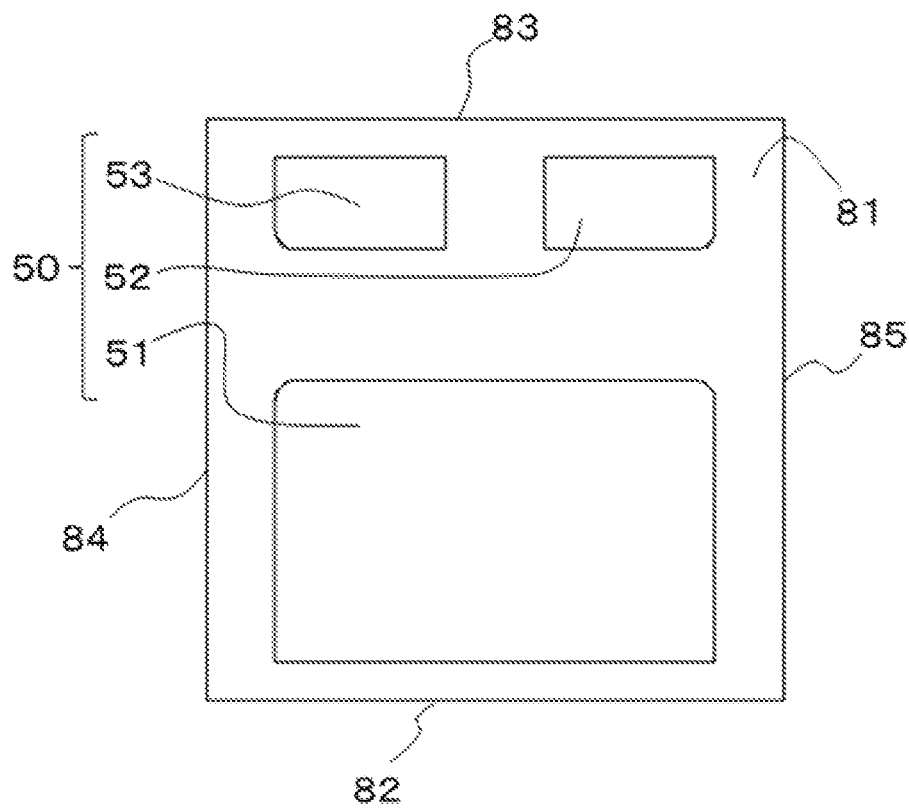
FIG. 1B is a schematic bottom view of the light-emitting device according to the first embodiment.
Figure 1C:
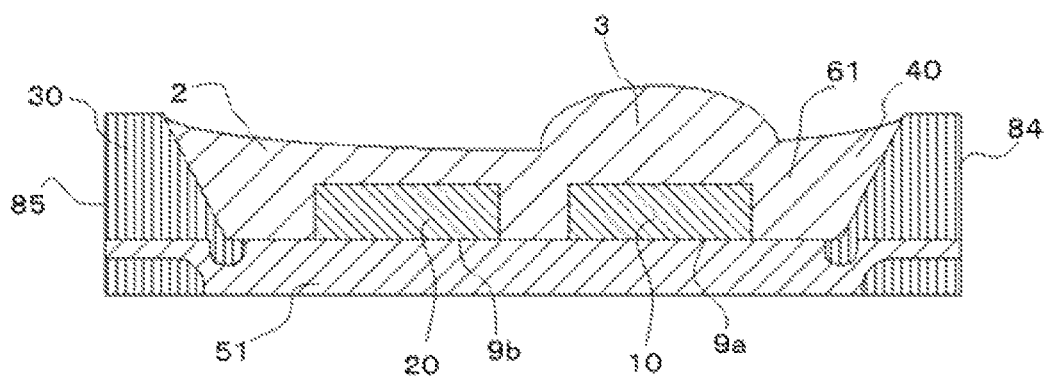
FIG. 1C is a schematic end view taken along the line 1C-1C in FIG. 1A.

FIG. 1A is a schematic top view of a light-emitting device 100 according to a first embodiment. FIG. 1B is a schematic bottom view of the light-emitting device 100. FIG. 1C is a schematic end view taken along the line 1C-1C in FIG. 1A. Illustration of a sealing member 40 is omitted in FIG. 1A to facilitate understanding of the interior of a recess 2. The light-emitting device 100 includes a first light-emitting element 10, a second light-emitting element 20, and the sealing member 40, which covers the first light-emitting element 10 and the second light-emitting element 20 and contains a first fluorescent material 61. The light-emitting device 100 according to the first embodiment further includes a package 1 having the recess 2. The first light-emitting element 10 and the second light-emitting element 20 are disposed on a bottom surface of the recess 2.

The package 1 is a base where the first light-emitting element 10 and the second light-emitting element 20 are disposed. The package 1 includes a plurality of leads 50 including a first lead 51, a second lead 52, and a third lead 53, and a resin portion 30 molded integrally with the plurality of leads 50. The package 1 has the recess 2, and an upper surface of the first lead 51, an upper surface of the second lead 52, and an upper surface of the third lead 53 are partly located on the bottom surface of the recess 2.

The package 1 illustrated in FIGS. 1A and 1B has an upper surface 80 and a lower surface 81 opposite to the upper surface 80. The package 1 has a substantially rectangular external shape in top view and has a first outer lateral surface 82, a second outer lateral surface 83 opposite to the first outer lateral surface 82, a third outer lateral surface 84, and a fourth outer lateral surface 85 opposite to the third outer lateral surface 84. At the outer lateral surfaces, the plurality of leads 50 are exposed from the resin portion 30 and are substantially in the same plane as the resin portion 30. Thus, at the first to third outer lateral surfaces 82 to 84, the plurality of leads 50 are not extended outward of the resin portion 30. This allows for providing a compact light-emitting device 100 so as to occupy a smaller area.

The lower surface 81 of the package 1 serves as a mounting surface for mounting the light-emitting device 100 on a mount base. At the lower surface 81 of the package 1, the first lead 51, the second lead 52, and the third lead 53 are exposed from the resin portion 30. With this configuration, heat generated by the first light-emitting element 10 and/or the second light-emitting element 20 is efficiently dissipated from the lower surface 81 of the package 1. At the lower surface 81 of the package 1, lower surfaces of the plurality of leads 50 are substantially in the same plane as a lower surface of the resin portion 30.

The first light-emitting element 10 and the second light-emitting element 20 function as a light source of the light-emitting device 100 and also as an excitation source of the fluorescent material described below. The first light-emitting element 10 and the second light-emitting element 20 have peak emission wavelengths of 430 nm to 480 nm. The first light-emitting element 10 and the second light-emitting element 20 having peak emission wavelengths larger than the near-ultraviolet range allows for reducing disadvantages of light in the near-ultraviolet range (for example, adverse affect on human bodies or irradiated objects, or great reduction in light-emitting efficiency of the light-emitting device due to deterioration of components of the light-emitting device).

The first light-emitting element 10 and the second light-emitting element 20 are electrically connected in parallel. This allows for driving the first light-emitting element 10 and the second light-emitting element 20 with different current values. By differing a current value of the current flowed to the first light-emitting element 10 from a current value of the current flowed to the second light-emitting element 20, chromaticities of light emitted toward areas above the light-emitting elements can easily be differed from each other.

In the light-emitting device 100 illustrated in FIG. 1A, the first light-emitting element 10 and the second light-emitting element 20 are disposed on the upper surface of the first lead 51. The first light-emitting element 10 includes positive and negative electrodes disposed on an upper surface of the first light-emitting element 10. One of the electrodes is connected to the second lead 52 with a wire, whereas the other electrode is connected to the first lead 51 with a wire. Similarly, the second light-emitting element 20 includes positive and negative electrodes disposed on an upper surface of the second light-emitting element 20. One of the electrodes is connected to the third lead 53 with a wire, whereas the other electrode is connected to the first lead 51 with a wire. Thus, the light-emitting device 100 includes the three leads to drive the light-emitting elements individually. Moreover, with the number of the plurality of leads 50 greatly reduced so that the light-emitting elements can be individually driven, the interfaces on the package 1 between the plurality of leads 50 and the resin portion 30 can be decreased. This configuration allows for preventing reduction in strength of the light-emitting device.

It is preferable that a partition member such as a wall is not disposed between the first light-emitting element 10 and the second light-emitting element 20. This allows for improving color mixing performance of the light-emitting device 100. More specifically, in the light-emitting device 100 illustrated in FIG. 1A, the first light-emitting element 10 and the second light-emitting element 20 are disposed in a single container (in the recess 2), and a partition member such as a wall is not disposed between the first light-emitting element 10 and the second light-emitting element 20. This configuration allows for facilitating mixing of color of light in the vicinity of the first light-emitting element 10 and color of light in the vicinity of the second light-emitting element 20 to provide the light-emitting device with good color mixing performance. However, a wall or a partition member may be disposed between the first light-emitting element 10 and the second light-emitting element 20.

In the light-emitting device 100 illustrated in FIG. 1A, the first light-emitting element 10 and the second light-emitting element 20 are disposed apart from each other in a top view. In a top view, the center of the first light-emitting element 10 is preferably located offset from the center of the second light-emitting element 20 both in the X-direction and in the Y-direction. In other words, it is preferable that the shortest distance between the first outer lateral surface 82 of the package 1 and the center of the first light-emitting element 10 is different from the shortest distance between the first outer lateral surface 82 and the center of the second light-emitting element 20, and also, the shortest distance between the third outer lateral surface 84 and the center of the first light-emitting element 10 is different from the shortest distance between the third outer lateral surface 84 and the center of the second light-emitting element 20. With the first light-emitting element 10 and the second light-emitting element 20 arranged offset from each other in a top view, the ratio of light that is absorbed by one of the light-emitting elements to light that is emitted from the other light-emitting element is decreased, so that the light-emitting device with good light-extracting efficiency can be provided.

The sealing member 40 covers the first light-emitting element 10 and the second light-emitting element 20. In the light-emitting device 100 illustrated in FIG. 1G, the sealing member 40 is located in the recess 2 and covers the upper surface and lateral surfaces of the first light-emitting element 10 and the upper surface and lateral surfaces of the second light-emitting element 20.

The sealing member 40 contains the first fluorescent material 61. The first fluorescent material 61 may contain one kind of fluorescent material or a plurality of kinds of fluorescent materials. With a plurality of types of fluorescent materials, color rendering performance of the light-emitting device 100 can be improved. The first fluorescent material 61 contains, for example, a fluorescent material having a composition represented by the following formula (1) and a fluorescent material having a composition represented by the following formula (2):

$$(Y,Lu,Gd)_3(Al,Ga)_5O_{12}:Ce \quad (1)$$

$$(Sr,Ca)AlSiN_3:Eu \quad (2)$$

The sealing member 40 has a protruding portion 3 at a portion of an upper surface of the sealing member 40. The first light-emitting element 10 is disposed on a first region 9a, which is located under the protruding portion 3. In other words, the protruding portion 3 is located above the first light-emitting element 10. The second light-emitting element 20 is disposed on a second region 9b, which is located under the upper surface of the sealing member 40. In FIG. 1G, both of the first region 9a and the second region 9b are located at the upper surfaces of the plurality of leads 50 in regions different from each other. In the first embodiment, the "first region" is a region located under the protruding portion 3, and the "second region" is a region other than the first region. With the protruding portion 3 above the first light-emitting element 10, the volume of a portion of the sealing member 40 located directly above the first light-emitting element 10 can be easily larger than the volume of a portion of the sealing member 40 located directly above the second light-emitting element 20. Accordingly, an amount of a portion of the first fluorescent material 61 located directly above the first light-emitting element 10 can be larger than an amount of a portion of the first fluorescent material 61 located directly above the second light-emitting element 20. As a result, of light emitted toward an area above the sealing member 40, light emitted toward an area above the first light-emitting element 10 can easily have a chromaticity different from light emitted toward an area above the second light-emitting element 20.

In the 1931 CIE chromaticity diagram, generally, the more red color components a light has, the larger the x-value of a chromaticity of light tends to be. Accordingly, for example, in the case of using yellow to red fluorescent materials as the first fluorescent material 61, an x-value of a chromaticity of light emitted toward an area above the first light-emitting element 10 is larger than an x-value of a chromaticity of light emitted toward an area above the second light-emitting element 20. The light-emitting device 100 includes the protruding portion 3 above the first light-emitting element 10. Therefore, the x-value of the chromaticity of light emitted toward an area above the first light-emitting element 10 can be larger than the x-value of the chromaticity of light emitted toward an area above the second light-emitting element 20. This allows for providing a light-emitting device configured to emit light having a color in a wide chromaticity range.

In the present specification, the expression "the chromaticity of light emitted toward an area above the first light-emitting element 10" can refer to a chromaticity of light emitted from the light-emitting device 100, for example, in the case of driving only the first light-emitting element 10. Similarly, the expression "the chromaticity of light emitted toward an area above the second light-emitting element 20" can refer to a chromaticity of the light-emitting device 100, for example, in the case of driving only the second light-emitting element 20.

In a top view, the protruding portion 3 is preferably located at such a position that the centroid of the protruding portion 3 substantially coincides with the center of the first light-emitting element 10. This allows the optical axis of the first light-emitting element 10 to coincide with the optical axis of the protruding portion 3, so that light emitted from the first light-emitting element 10 can be efficiently extracted to the outside. In a top view, an entirety of the first light-emitting element 10 may be located under the protruding portion 3 or only a part of the first light-emitting element 10 may be located under the protruding portion 3. In the case where the entirety of the first light-emitting element 10 is located under the protruding portion 3, it is preferably that the maximum width of the protruding portion 3 in a top view is substantially equal to the maximum width of the first light-emitting element 10 in a top view. With this configuration, light emitted toward an area above the first light-emitting element 10 can be efficiently extracted outside, and a ratio of light emitted from the second light-emitting element 20, which is adjacent to the first light-emitting element 10, that enters the protruding portion 3 can be reduced. Thus, the chromaticity of light emitted toward the area above the first light-emitting element 10 and the chromaticity of light emitted toward the area above second light-emitting element 20 can be efficiently differed from each other. The maximum width of the protruding portion 3 in top view is, for example, in a range of 300 μm to 1000 μm. A distance between the lowest part and the highest part of the protruding portion 3 in the height direction is, for example, in a range of 150 μm to 500 μm.

The protruding portion 3 can be formed at the same time as the sealing member 40 by molding. Alternatively, a first sealing member may be disposed in the recess 2, and then, a second sealing member containing the fluorescent material 61 may be disposed using a technique such as potting in a different step.

In the case of driving only the first light-emitting element 10, the light-emitting device 100 can emit light having a color temperature of, for example, 1800 K to 5000 K. In the case of driving only the second light-emitting element 20, for example, a color temperature of emitted light is higher than the color temperature of emitted light in the case of driving only the first light-emitting element 10, and the light-emitting device 100 can emit light having a color temperature of 3500 K to 7000 K. Moreover, adjustment of values of current flowed to the first light-emitting element 10 and the second light-emitting element 20 allows the light-emitting device 100 to emit light having a color temperature of 1800 K to 7000 K. This allows for obtaining a light-emitting device configured to emit light in a wide range of correlated color temperature.

Members used in the light-emitting device 100 according to certain embodiments of the present invention will be described below in more detail.

Package

The package 1 is a base where light-emitting elements are disposed. The package 1 includes a base body and a plurality of leads (i.e., a plurality of electrode portions). Examples of a material of the base body of the package 1 includes ceramics such as aluminum oxide and aluminum nitride, resins (such as silicone resins, modified silicone resins, epoxy resins, modified epoxy resins, unsaturated polyester resins, phenol resins, polycarbonate resins, acryl resins, trimethylpentene resins, polynorbornene resins, and hybrid resins including one or more of these resins), pulp, glass, and composite materials including these materials. The base body of the package 1 may have a single-layer structure or a multilayer structure including a plurality of layers.

For the package 1, for example, a package including the resin portion 30 and the plurality of leads 50 used in the light-emitting device 100 in FIG. 1A may be preferably employed. This allows for providing an inexpensive light-emitting device with high heat dissipation performance. In the light-emitting device 100 in FIG. 1A, although, at the outer lateral surfaces of the package 1, the plurality of leads 50 are not extended outward of the resin portion 30, the light-emitting device in the present embodiment is not limited to this configuration. That is, at the outer lateral surfaces of the package 1, the plurality of leads 50 may be extended outward of the resin portion 30. With this arrangement, heat generated by the light-emitting elements can be efficiently dissipated outside.

Figure 1D:
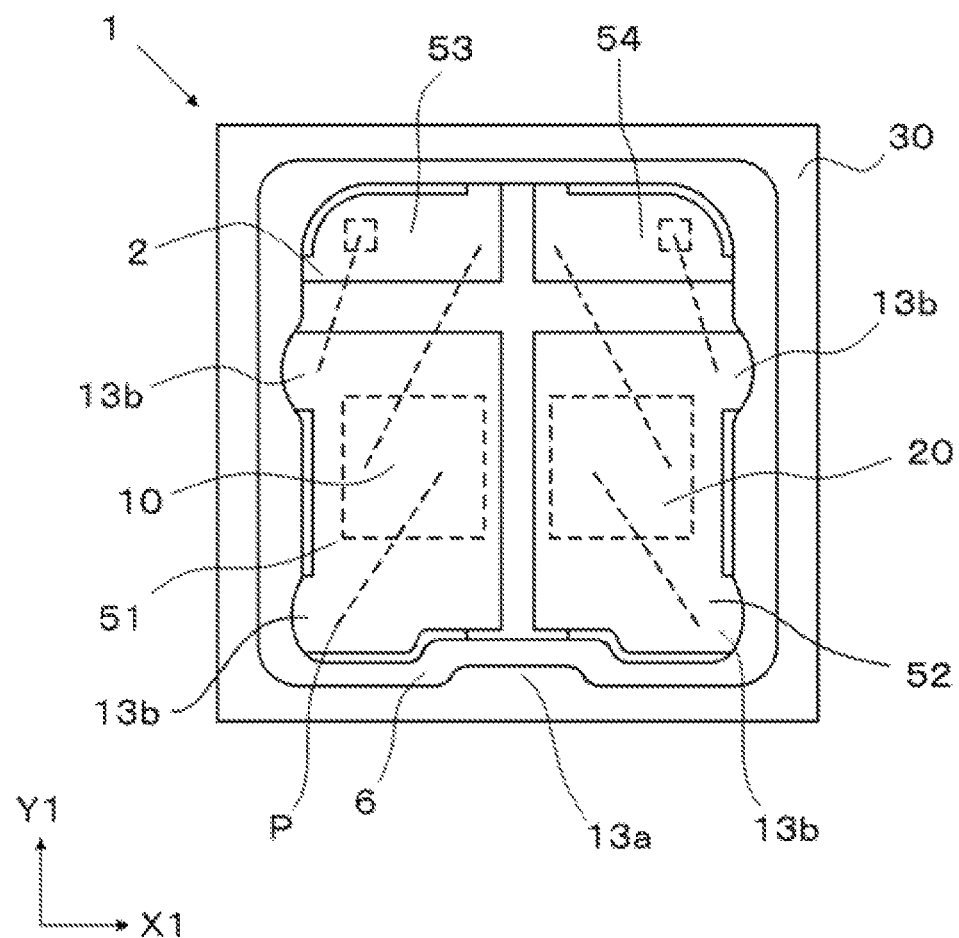
FIG. 1D is a schematic top view of an example of a package.

FIG. 1D shows a variant example of the package 1. In FIG. 1D, regions on which the first light-emitting element 10 and the second light-emitting element 20, protection elements, and wires are to be disposed are indicated by dashed lines. The package 1 shown in FIG. 1D includes a first lead 51, a second lead 52, a third lead 53, and a fourth lead 54. The first light-emitting element 10 is to be disposed on an upper surface of the first lead 51, and the second light-emitting element 20 is to be disposed on un upper surface of the second lead 52. One electrode of positive and negative electrodes of the first light-emitting element 10 is to be connected to the first lead 51 via a wire, and the other electrode of the positive and negative electrodes is to be connected to the third lead 53 via a wire. Further, one electrode of positive and negative electrodes of the second-light emitting element 20 is to be connected to the second lead 52 via a wire, and the other electrode of the positive and negative electrodes is to be connected to the fourth lead 54 via a wire. With this arrangement, a conducting path of the first light-emitting element 10 (i.e., the first lead 51 and the third lead 53) and a conductive path of the second light-emitting element 20 (i.e., the second lead 52 and the fourth lead 54) can be separated from each other. Accordingly, a current value through the first light-emitting element 10 and a current value through the second light-emitting element can be highly freely adjusted.

The package 1 shown in FIG. 1D includes a projecting portion 13a at a lateral wall of a recess 2. The projecting portion 13a protrudes in a direction from a lateral surface of the package 1 toward an inside of the package 1. The projecting portion 13a is preferably disposed over at least two of the plurality of leads 50 This allows for increasing strength between the at least two of the plurality of leads 50, so that strength of the package 1 can be increased. In the package 1 shown in FIG. 1D, the projecting portion 13a is disposed over the first lead 51 and the second lead 52. This arrangement allows for increasing strength of the package 1. Further, when spacing regions between each of the plurality of leads 50 in the package 1 is located on a straight line between a corresponding one of the lateral walls defining the recess 2 and opposite one of the lateral walls, strength of the package 1 may be reduced. In such a package 1, with the projecting portion 13a located on an extension line of the spacing regions between each of the plurality of the leads 50, reduction in strength of the package 1 can be prevented. In the package 1 shown in FIG. 1D, the projecting portion 13a is disposed on a straight line passing through a spacing region between the first lead 51 and the second lead 52 and a spacing region between the third lead 53 and the fourth lead 54. This allows for effectively increasing strength of the package 1.

In an X1 direction along a lateral wall 6 having the projecting portion 13a, the projecting portion 13a at a bottom surface of the recess 2 preferably has a width greater than a spacing distance between the first lead 51 and the second lead 52. With such a width, the projecting portion 13a can be disposed over a plurality of leads, so that reduction in strength of the package 1 can be prevented. Further, a width of the projecting portion 13a at the bottom surface of the recess 2 may be greater than a spacing distance between the first light-emitting element 10 and the second light-emitting element 20. Even further, a width of the projecting portion 13a at the bottom surface of the recess 2 may be greater than a width of the projecting portion 13a at an opening of the recess 2. With such a width, when the projecting portion 13a is formed by molding, a mold can be easily removed, so that chipping of a portion of the projecting portion 13a can be prevented. In the X1 direction, the largest width of the projecting portion 13a is in a range of 0.05 times to once as large as a width of the lateral wall 6, preferably in a range of 0.1 times to 0.3 times as large as a width of the lateral wall 6. Further, in the package 1 shown in FIG. 1D, an upper surface of the projecting portion 13a is in the same plane as an upper surface of the other portion of the resin portion 30. With this arrangement, the projecting portion 13a can be easily recognized when viewed from above, and, for example, the projecting portion 13a can serve as a recognition object portion, which indicates a polarity of corresponding one(s) of the plurality of leads 50.

In a Y1 direction perpendicular to the X1 direction, the projecting portion 13a is located closer to the lateral wall 6 than a connecting portion P between a wire extended from the first light-emitting element 10 or the second light-emitting element 20 and a corresponding one of the first lead 51 and the second lead 52. With this arrangement, an area of a region on which a wire is to be connected can be increased, so that connection using a wire can be facilitated. In the Y1 direction, the projecting portion 13a at the bottom surface of the recess 2 may be located farther from the lateral wall 6 than the connecting portion P between a wire extended from the first light-emitting element 10 or the second light-emitting element 20 and a corresponding one of the first lead 51 and the second lead 52.

In a top view, the projecting portion 13a can have a linear-symmetrical shape with respect to a line extending through a center of one of the spacing regions between corresponding ones of the plurality of leads 50. With such a shape, when an external stress is applied to the package 1, concentration of the stress at only one of the plurality of leads 50 can be reduced. Accordingly, deformation of the package 1 can be reduced.

A single projecting portion 13a or a plurality of projecting portions 13a may be disposed. For example, the projecting portion 13a may be disposed over the third lead 53 and the fourth lead 54, over the first lead 51 and the third lead 53, or over the second lead 52 and the fourth lead 54.

The package 1 preferably has a recessed portion 13b in lateral walls defining the recess 2. With the recessed portion 13b in the package 1, adhering strength between the package 1 and the sealing member 40 can be increased. Further, connecting an end portion of a wire, the other end portion of which is connected to the first light-emitting element 10, the second light-emitting element 20, or one of the protecting elements, to a portion near the recessed portion 13b allows for obtaining a large region to which the wire is to be connected. Accordingly, a possibility of connection failure occurring between wires can be reduced.

An external shape of the package 1 and an opening shape of the recess 2 may be, for example, rectangles, other polygons, circles, or ellipses in top view. In a top view, an opening of the recess 2 may have a shape that is partly modified from these shapes. For example, a corner of the opening of the recess 2 with a substantially rectangular shape may be rounded in a top view, as shown in FIG. 1A. With such a shape, a portion of the opening can function as an anode mark or a cathode mark indicative of the polarity of a corresponding one of the leads.

Figure 2A:
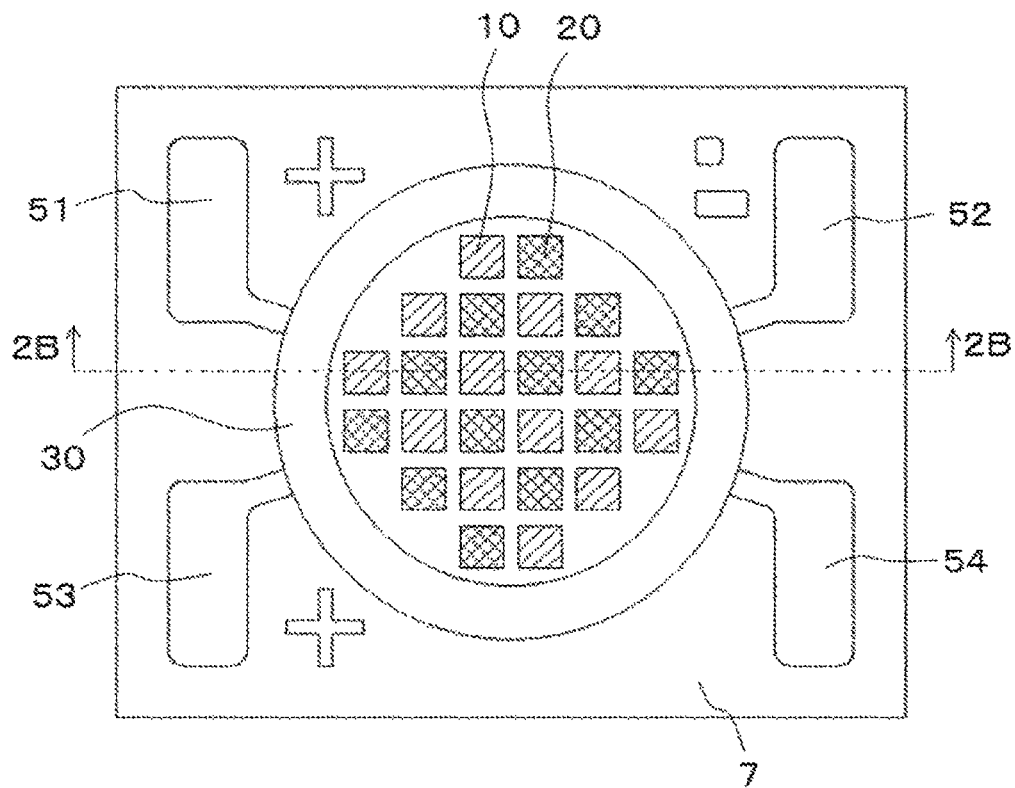
FIG. 2A is a schematic top view of another example of the package.
Figure 2B:
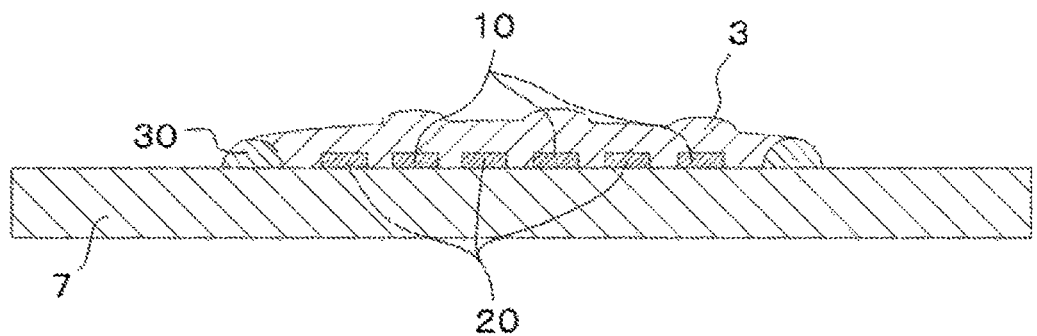
FIG. 2B is a schematic end view taken along the line 2B-2B in FIG. 2A.

Other examples of the package 1 include, as illustrated in FIGS. 2A and 2B, a package including a flat plate-shaped base board 7 and the frame-shaped resin portion 30, which is disposed on an upper surface of the base board 7 and made of a light-reflective resin. FIG. 2A is a schematic top view of the package 1 with such a structure, and FIG. 2B is a schematic end view taken along the line 2B-2B in FIG. 2A. The sealing member is omitted from FIG. 2A. The frame-shaped resin portion 30 serves as a reflector for reflecting light and as a wall for filling the sealing member. A plurality of leads (for example, the first lead 51, the second lead 52, the third lead 53, and a fourth lead 54) are disposed on an upper surface of the base board 7. The package 1 having such a structure has an appropriate size in accordance with the number of light-emitting elements mounted, purposes, and uses. The base board 7 is preferably made of an insulating material, and also preferably made of a material that are unlikely to light emitted from members such as the light-emitting elements and external light are unlikely to transmit. In order to increase light reflectance of the package 1, a reflective member may be disposed on the light-emitting element mounting surface. The reflective member is made of a material in which reflective particles of, for example, titanium oxide and an organic or inorganic binder are kneaded. Examples of the reflective member include what is called white resist, white ink, and ceramic ink. For the organic binder, silicone resins having good heat resistance and light resistance are particularly preferable. With this configuration, light is reflected at a surface of the base board 7 to provide the light-emitting device with high light-extracting efficiency.

In the light-emitting device illustrated in FIGS. 2A and 2B, the first light-emitting elements 10 and the second light-emitting elements 20 are alternately arranged. With this arrangement, colors of light emitted from the first light-emitting elements 10 and the second light-emitting elements 20 are sufficiently mixed to reduce unevenness in color of light emitted from the light-emitting device in top view. However, the arrangement of the first light-emitting elements 10 and the second light-emitting elements 20 is not limited to this. For example, the first light-emitting elements 10 and the second light-emitting elements 20 may be arranged in rows in the X-direction or the Y-direction or arranged concentrically.

The package 1 may not include the recess 2. For example, a base plate with an elongated shape may be employed for the package 1. Such a package 1 has elasticity, for example, which allows the package 1 to be stored in a rolled state in which it is wound on a reel and also to be attached along a curved surface. For the base plate, insulating resins such as polyimide, polyethylene terephthalate, and polyethylene naphthalate may be suitably used. The base plate may have a thickness in a range of, for example, approximately 10 μm to 200 μm.

Plurality of Leads

The plurality of leads 50 are electrically conductive and function as electrodes for supplying power to the light-emitting elements. Examples of a base member of the plurality of leads 50 include metals such as copper, aluminum, gold, silver, iron, nickel, alloys of these metals, phosphor bronze, and copper-iron alloys. These metals may have a single-layer structure or a layered structure (for example, clad material). In particular, copper, which is inexpensive and exhibits high heat dissipation performance, is preferably used for the base member. A metal layer may be formed on a surface of the base member of the plurality of leads 50. The metal layer contains, for example, silver, aluminum, nickel, palladium, rhodium, gold, copper, or alloys of these metals. The metal layer may be wholly or partly formed on a surface of the plurality of leads 50. The metal layer on an upper surface of each of the leads may be different from a metal layer on a lower surface of the lead. For example, a metal layer formed on the upper surface of each lead has a layered structure of a plurality of layers including a nickel layer and a silver layer, and a metal layer formed on the lower surface of the lead does not include a nickel layer. Further, for example, a metal layer containing silver or the like and formed on the upper surface of the lead may be thicker than a metal layer containing silver or the like and formed on the lower surface of the lead.

In the case of forming a metal layer containing silver on the outermost surfaces of the plurality of leads 50, a protection layer of a material such as silicon oxide is preferably formed on a surface of the metal layer containing silver. This allows for preventing discoloration of the metal layer containing silver due to, for example, a sulfur component in the air. For a method of forming the protection layer, vacuum processing such as sputtering may be used, and other known methods may be alternatively used.

The plurality of leads 50 include the first lead 51, the second lead 52, and the third lead 53. With the plurality of leads 50 including at least three leads, a plurality of light-emitting elements may be individually driven. The plurality of leads 50 may include four or more leads. For example, the plurality of leads 50 may include a fourth lead in addition to the first lead 51, the second lead 52, and the third lead 53. The fourth lead may function as a heat dissipation member or may function as an electrode, similarly to the first lead 51 and other leads.

Resin Portion

Examples of a resin material used for a base material of the resin portion 30 include a thermosetting resin and a thermoplastic resin. More specifically, an epoxy resin compound, a silicone resin compound, a modified epoxy resin compound such as a silicone-modified epoxy resin, a modified silicone resin compound such as epoxy-modified silicone resin, an unsaturated polyester resin, a saturated polyester resin, a polyimide resin compound, a modified polyimide resin compound, or the like, polyphthalamide (PPA), polycarbonate resin, polyphenylene sulfide (PPS), a liquid crystal polymer (LCP), a resin such as an ABS resin, a phenolic resin, an acrylic resin or a PBT resin may be used. In particular, a thermosetting resin such as an epoxy resin compound or a modified silicone resin compound are preferably used.

Also, for the resin material of the resin portion 30, silicone resin compounds (such as SMC resins) having a high heat resistance and light resistance are preferably used.

A resin material used for the base material of the resin portion 30 as described above preferably contains a light-reflective substance. For the light-reflective substance, a material that does not easily absorb light emitted from the light-emitting elements and has a refractive index largely different from a refractive index of the resin material used for the base material is preferably used. Examples of such a light-reflective substance include titanium oxide, zinc oxide, silicon oxide, zirconium oxide, aluminum oxide, and aluminum nitride.

In order to improve contrast of the light-emitting device 100, the resin portion 30 may contain a filler having a lower reflectivity with respect to external light (typically, sunlight) of the light-emitting device 100. In this case, the resin portion 30 is black or of a color close to black. For the filler, for example, carbon such as acetylene black, active carbon, and graphite, transition metal oxide such as iron oxide, manganese dioxide, cobalt oxide, or molybdenum oxide, or colored organic pigment may be used in accordance with purposes.

Figure 3A:
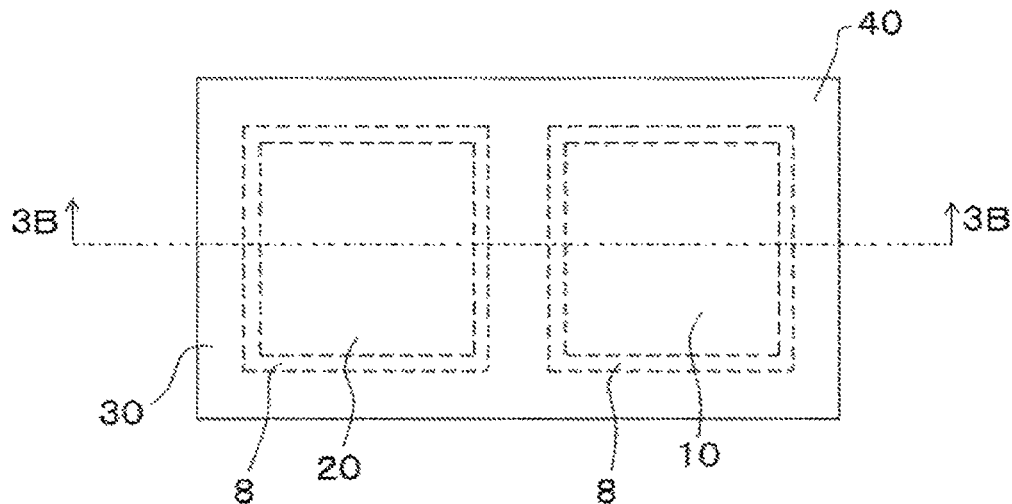
FIG. 3A is a schematic top view of an example of the light-emitting device.
Figure 3B:
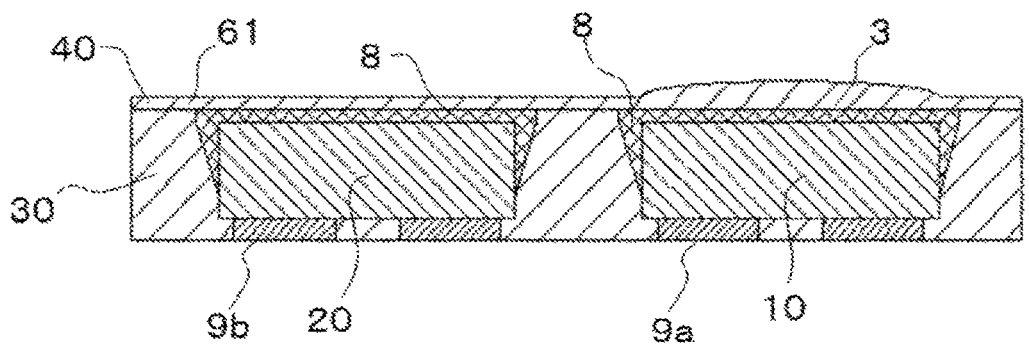
FIG. 3B is a schematic end view taken along the line 3B-3B in FIG. 3A.

The light-emitting device according to the present invention may not necessarily include the package 1. FIG. 3A is a schematic top view of an example of the light-emitting device, and FIG. 3B is a schematic end view taken along the line 3B-3B in FIG. 3A. The light-emitting device 100 illustrated in FIGS. 3A and 3B does not include the package 1. The light-emitting device 100 includes the first light-emitting element 10, the second light-emitting element 20, light-transmissive layers 8 disposed on lateral surfaces of the first and second light-emitting elements 10 and 20, the resin portion 30 covering outer surfaces of the light-transmissive layers 8, and the sealing member 40 above the light-emitting elements.

Each of the light-transmissive layers 8 covers the lateral surfaces of a respective one of the first and second light-emitting elements 10 and 20, and guides light emitted from the lateral surfaces of the respective one of the light-emitting elements 10 and 20 toward an upper surface of the light-emitting device. In other words, light that has reached a lateral surface of the light-emitting element 10 or 20 is partly reflected by the lateral surface and attenuated inside the light-emitting element, but, with the light-transmissive layers 8, light emitted from the light-emitting element 10 or 20 passes through a respective one of the light-transmissive layers 8 to be extracted outside the light-emitting element. The resin materials described as examples of the resin portion 30 may be used for the light-transmissive layers 8. In particular, a light-transmissive thermosetting resin such as a silicone resin, a modified silicone resin, an epoxy resin, and a phenol resin is preferable. The light-transmissive layers 8 preferably have high light transmissivity. In view of this, it is generally preferable that additives for reflecting, absorbing or scattering light are not added to the light-transmissive layers 8.

The resin portion 30 covers the outer surfaces of the light-transmissive layers 8 disposed on the lateral surfaces of the light-emitting elements and covers a portion of each of the lateral surfaces of each of the light-emitting elements 10 and 20. When a difference between a thermal-expansion coefficient of the light-transmissive layers 8 and a thermal-expansion coefficient the light-emitting elements (hereinafter referred to as "first thermal-expansion coefficient difference $\Delta T30$") is compared with a difference between a thermal-expansion coefficient of the resin portion 30 and a thermal-expansion coefficient of the light-emitting elements (hereinafter referred to as "second thermal-expansion coefficient difference $\Delta T40$"), such a resin material that satisfies $\Delta T40 < \Delta T30$ is selected for the resin portion 30. This allows for preventing detachment of the light-transmissive layers 8 from the light-emitting elements.

First Light-Emitting Element and Second Light-Emitting Element

Each of the first light-emitting element 10 and the second light-emitting element 20 functions as a light source of the light-emitting device 100 and also as an excitation source of the fluorescent material. Light-emitting diodes or the like may be used for the first light-emitting element 10 and the second light-emitting element 20, and the first light-emitting element 10 and the second light-emitting element 20 may contain nitride semiconductor ($In_xAl_yGa_{1-x-y}N$, $0 \leq x$, $0 \leq y$, $x+y \leq 1$) adapted to emit light in a visible light range.

Each of the first light-emitting element 10 and the second light-emitting element 20 has a peak emission wavelength in a range of 430 nm to 480 nm. With the first light-emitting element 10 and the second light-emitting element 20 each having a peak emission wavelength longer than the near-ultraviolet range, it is possible to reduce disadvantages of light in the near-ultraviolet range (for example, adverse effect on human bodies or irradiated objects, or great reduction in light-emitting efficiency of the light-emitting device due to deterioration of constituent members of the light-emitting device). The light-emitting device 100 includes the first light-emitting element 10 and the second light-emitting element 20. The light-emitting device 100 may further include another light-emitting element in addition to the first light-emitting element 10 and the second light-emitting element 20.

Sealing Member

The light-emitting device 100 includes the sealing member 40 covering the first light-emitting element 10 and the second light-emitting element 20. The sealing member 40 can protect the light-emitting elements and other components from, for example, external force, dust, and moisture. The sealing member 40 preferably transmits 60% or more of light emitted from the light-emitting elements, and more preferably transmits 90% or more of the light. For a base material of the sealing member 40, the resin material used for the resin portion 30 may be used. For a resin material to be used for the base material, a thermosetting resin or a thermoplastic resin may be used. For example, a silicone resin, an epoxy resin, an acryl resin, or a resin including one or more of these resins may be used. The sealing member 40 may be formed of a single layer or a plurality of layers. In the sealing member 40, light-scattering particles of titanium oxide, silicon oxide, zirconium oxide, aluminum oxide or such a substance may be dispersed.

The sealing member 40 contains the first fluorescent material 61 adapted to convert the wavelength of light emitted from the light-emitting elements. The first fluorescent material 61 may include a single kind of fluorescent material or a plurality of kinds of fluorescent material. Using a plurality of kinds of fluorescent material for the first fluorescent material 61 allows for improving color rendering performance and the like of the light-emitting device 100.

The first fluorescent material 61 is a fluorescent material excitable by light emitted from the first light-emitting element 10 and the second light-emitting element 20, and examples of the first fluorescent material 61 include (Ca, Sr, Ba)$_5$(PO$_4$)$_3$(Cl, Br):Eu, (Sr, Ca, Ba)$_4$Al$_{14}$O$_{25}$:Eu, (Ca, Sr, Ba)$_8$MgSi$_4$O$_{16}$(F, Cl, Br)$_2$:Eu, (Y, Lu, Gd)$_3$(Al, Ga)$_5$O$_{12}$:Ce, (Sr, Ca)AlSiN$_3$:Eu, 3.5MgO.0.5MgF$_2$.GeO$_2$:Mn, Ca$_3$Sc$_2$Si$_3$O$_{12}$:Ce, CaSc$_2$O$_4$:Ce, (La, Y)$_3$Si$_6$N$_{11}$:Ce, (Ca, Sr, Ba)$_3$Si$_6$O$_9$N$_4$:Eu, (Ca, Sr, Ba)$_3$Si$_6$O$_{12}$N$_2$:Eu, (Ba, Sr, Ca)Si$_2$O$_2$N$_2$:Eu, (Ca, Sr, Ba)$_2$Si$_5$N$_8$:Eu, (Ca, Sr, Ba)S:Eu; (Ba, Sr, Ca)Ga$_2$S$_4$:Eu, and K$_2$(Si, Ti, Ge)F$_6$:Mn.

For the first fluorescent material 61, in particular, a fluorescent material having a large half band-width are preferably used. For example, (Y, Lu, Gd)$_3$(Al, Ga)$_5$O$_{12}$:Ce is preferable. A mixture of (Y, Lu, Gd)$_3$(Al, Ga)$_5$O$_{12}$:Ce and (Sr, Ca)AlSiN$_3$:Eu is more preferable. This allows for improving color rendering performance of the light-emitting device.

The content of the fluorescent material is preferably, for example, approximately 9 weight % to 60 weight % of the total weight of the sealing member 40.

The sealing member 40 may be made of an inorganic material such as glass and sintered bodies of fluorescent material. This allows for improving reliability of the light-emitting device when the light emitting device 100 has a high output.

Protection Element

The light-emitting device 100 may include a protection device to improve electrostatic breakdown resistance. In the light-emitting device 100 illustrated in FIG. 1A, a protection element 11 is disposed on the upper surface of the second lead 52. A single protection element or a plurality of protection elements may be provided. For example, in the light-emitting device 100, a single protection element may be provided for each of the light-emitting elements. With the light-emitting elements disposed on different conduction paths in the light-emitting device 100, providing a protection element for each of the light-emitting elements allows for further improving electrostatic breakdown resistance of the light-emitting device 100.

Variant Examples of First Embodiment

Figure 4A:
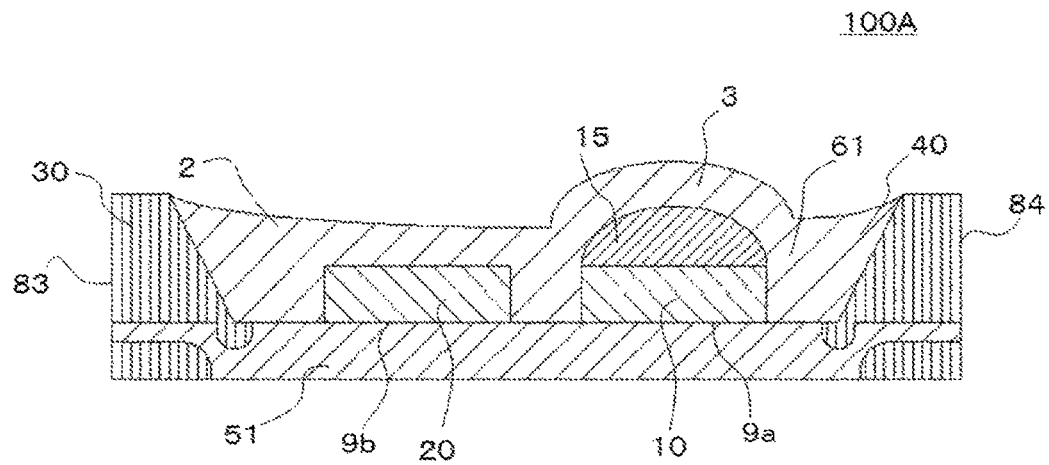
FIG. 4A is a schematic end view of a light-emitting device according to a modification of the first embodiment.

FIG. 4A is a schematic end view of a light-emitting device 100A according to a modification of the first embodiment. The light-emitting device 100A is different from the light-emitting device 100 according to the first embodiment mainly in that the light-emitting device 100A further includes a first light-transmissive member 15 between the protruding portion 3 and the upper surface of the first light-emitting element 10. Therefore, description of the light-emitting device 100A will be focused on such differences from the light-emitting device 100.

The light-emitting device 100A includes the first light-transmissive member 15 disposed on the upper surface of the first light-emitting element 10 and located under the upper surface of the sealing member 40. More specifically, the light-emitting device 100A includes the first light-transmissive member 15 between the upper surface of the protruding portion 3 and the upper surface of the first light-emitting element 10. In the light-emitting device 100A illustrated in FIG. 4A, the first light-transmissive member 15 covers the upper surface of the first light-emitting element 10, but does not cover the lateral surfaces of the first light-emitting element 10.

The first light-transmissive member 15 contains, for example, a second fluorescent material 62. For the second fluorescent material 62, a fluorescent material such as a red fluorescent material having a large half band-width is preferably used. Using the red fluorescent material for the second fluorescent material 62 allows for increasing an x-value of a chromaticity of light emitted toward an area above the first light-emitting element 10, so that the chromaticity of light emitted upward of the first light-emitting element 10 can be easily different from a chromaticity of light emitted upward of the second light-emitting element 20. The chromaticity of light emitted toward an area above the first light-emitting element 10 can be different than a chromaticity of light emitted from the first light-transmissive member 15. In the case where the red fluorescent material is used for the second fluorescent material 62, the half band-width of the second fluorescent material 62 is, for example, 80 nm or larger and 100 nm or less, and preferably, 85 nm or larger and 95 nm or less. For such a second fluorescent material 62, red fluorescent materials having a composition represented by the following formula (3) may be used:

$$(Sr,Ca)AlSiN_3:Eu \qquad (3)$$

Using a red fluorescent material having a composition represented by the formula (3) allows for improving color rendering performance of the light-emitting device and improving light-extracting efficiency of the light-emitting device.

The content of the second fluorescent material 62 is, for example, 33 weight % to 60 weight % of the entire weight of the first light-transmissive member 15.

The first light-transmissive member 15 preferably covers only the upper surface of the first light-emitting element 10. In other words, it is preferable that the first light-transmissive member 15 cover the upper surface of the first light-emitting element 10, and does not cover the lateral surfaces of the first light-emitting element 10. With this configuration, in the case of using a fluorescent material having high excitation efficiency for the first fluorescent material 61 in the sealing member 40, light laterally emitted from the first light-emitting element 10 is efficiently excited. This allows for providing the light-emitting device with good light-extracting efficiency.

The first light-transmissive member 15 is formed in various methods. For example, the first light-transmissive member 15 may be formed by printing, potting, and spraying resin material or applying sheet-shaped or block-shaped resin material with an adhesive. The light-transmissive member containing a fluorescent material may be formed by using a method such as electrophoresis deposition.

Figure 4B:
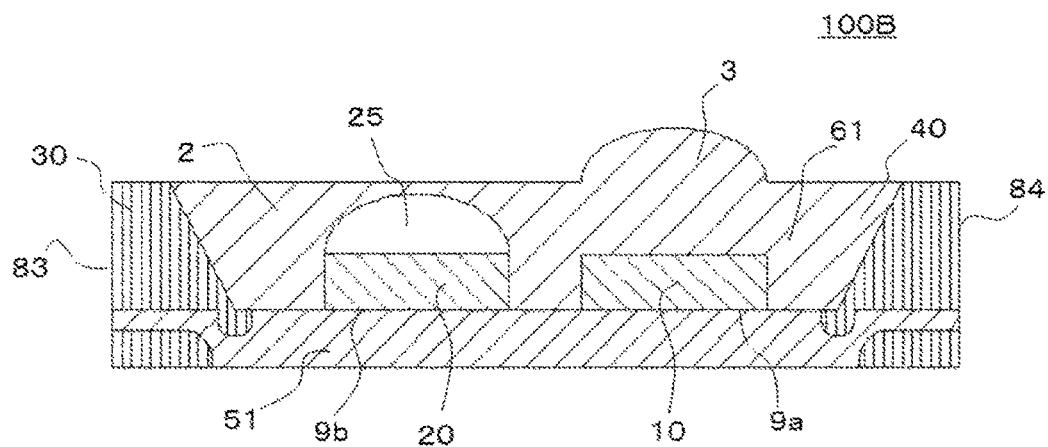
FIG. 4B is a schematic end view of a light-emitting device according to another modification of the first embodiment.

FIG. 4B is a schematic end view of a light-emitting device 100B according to another variant example of the first embodiment. The light-emitting device 100B is different from the light-emitting device 100 according to the first embodiment in that the light-emitting device 100B further includes the second light-transmissive member 25 between the upper surface of the sealing member 40 and the upper surface of the second light-emitting element 20. Therefore, description of the light-emitting device 100B will be focused on such differences from the light-emitting device 100.

The light-emitting device 100B includes the second light-transmissive member 25 disposed at the upper surface of the second light-emitting element 20 and under the upper surface of the sealing member 40. The second light-transmissive member 25 contains, for example, no fluorescent material. In the case where the second light-transmissive member 25 contains no fluorescent material, a large portion of light from the second light-transmissive member 25 is light emitted from the second light-emitting element 20 having a large amount of blue components. Accordingly, an x-value of a chromaticity of light emitted toward an area above the second light-emitting element 20 is relatively smaller than an x-value of a chromaticity of light emitted toward an area above the first light-emitting element 10. Thus, the chromaticity of light emitted toward an area above the first light-emitting element 10 can be easily different from the chromaticity of light emitted toward an area above the second light-emitting element 20.

With the second light-transmissive member 25 disposed on the upper surface of the second light-emitting element 20, an amount of the first fluorescent material 61 at a portion located above the second light-emitting element 20 is reduced, so that a ratio of light that is excited by the first fluorescent material 61 to light that is emitted toward an area above the second light-emitting element 20 is reduced. Accordingly, for example, in the case where the first fluorescent material 61 contains a fluorescent material of a color in a range of yellow to red, an x-value of a chromaticity of light emitted toward an area above the second light-emitting element 20 can be relatively smaller as compared with the case of a light-emitting device without the second light-transmissive member 25. Thus, the chromaticity of light emitted toward an area above the first light-emitting element 10 can be easily different from the chromaticity of light emitted toward an area above the second light-emitting element 20.

Figure 4C:
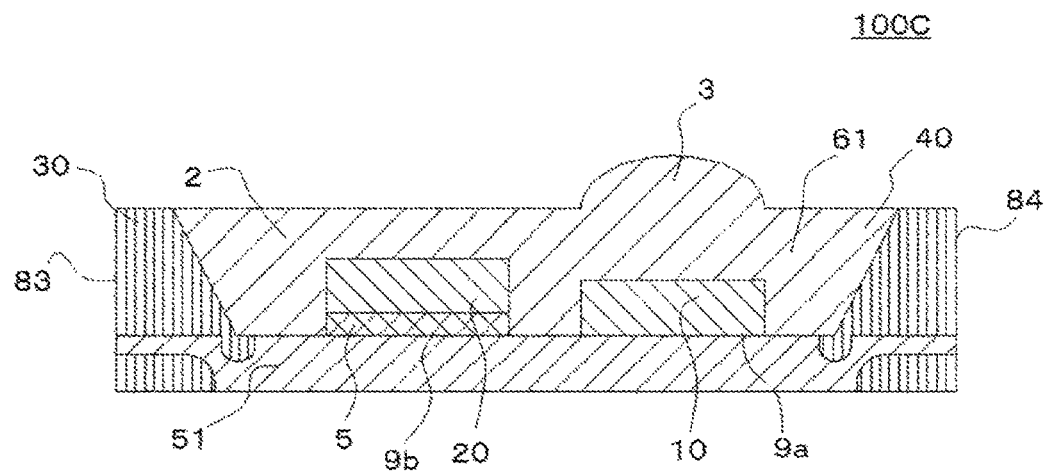
FIG. 4C is a schematic end view of a light-emitting device according to even another modification of the first embodiment.

FIG. 4C is a schematic end view of a light-emitting device 100C according to another modification of the first embodiment. The light-emitting device 100C is different from the light-emitting device 100 according to the first embodiment mainly in that the light-emitting device 100C further includes a base portion 5 under the second light-emitting element 20. Therefore, description of the light-emitting device 100C will be focused on such differences from the light-emitting device 100.

The light-emitting device 100C includes the base portion 5 under the second light-emitting element 20. With the base portion 5 disposed under the second light-emitting element 20, an amount of the first fluorescent material 61 at a portion located above the second light-emitting element 20 is reduced, so that a ratio of light excited by the first fluorescent material 61 of light emitted toward an area above the second light-emitting element 20 can be reduced. Accordingly, for example, in the case where the first fluorescent material 61 contains yellow to red fluorescent materials, an x-value of a chromaticity of light emitted toward an area above the second light-emitting element 20 can be relatively smaller as compared with the case of a light-emitting device without the second light-transmissive member 25. Thus, the chromaticity of light emitted toward an area above the first light-emitting element 10 is readily made different from the chromaticity of light emitted toward an area above the second light-emitting element 20.

First Light-Transmissive Member and Second Light-Transmissive Member

The first light-transmissive member 15 is disposed on the upper surface of the first light-emitting element 10, and the second light-transmissive member 25 is disposed on the upper surface of the second light-emitting element 20. The first light-transmissive member 15 or the second light-transmissive member 25 may be disposed directly on the upper surface of a corresponding one of the first light-emitting element 10 and the second light-emitting element 20, or disposed above the corresponding one of the first light-emitting element 10 and the second light-emitting element 20 with a different material (such as the protection layer described above) disposed between the first light-transmissive member 15 and the upper surface of the corresponding one of the first light-emitting element 10 and the second light-emitting element 20.

The first light-transmissive member 15 or the second light-transmissive member 25 may further cover lateral surfaces of a corresponding one of the first light-emitting element 10 and the second light-emitting element 20. A light emitting device according to another embodiment of the present invention may include both the first light-transmissive member 15 on the first light emitting element 10 and the second light-transmissive member 25 on the second light emitting element 20. In such a light emitting device, each of the first light-transmissive member 15 and the second light-transmissive member 25 may cover the upper surface and the lateral surfaces of a respective one of the first light-emitting element 10 and the second light-emitting element 20, or, for example, either the first light-transmissive member 15 or the second light-transmissive member 25 may cover the upper surface and the lateral surfaces of a corresponding one of the first light-emitting element 10 and the second light-emitting element 20.

The first light-transmissive member 15 or the second light-transmissive member 25 may have various shapes. In particular, as illustrated in FIGS. 4A and 4B, it is preferable that the first light-transmissive member 15 or the second light-transmissive member 25 has a substantially semispherical or substantially semiellipsoidal shape. In other words, it is preferable that the entire upper surfaces of the first light-transmissive member 15 or the second light-transmissive member 25 are curved. This configuration allows for reducing light emitted from the first light-emitting element 10 or the second light-emitting element 20 and then reflected by the surfaces of the first light-transmissive member 15 or the second light-transmissive member 25 and returns to the first light-emitting element 10 or the second light-emitting element 20.

For a resin material used for a base material of the first light-transmissive member 15 or the second light-transmissive member 25, a thermosetting resin, a thermoplastic resin, or the like may be used. For the resin material used for the base material of the first light-transmissive member 15 or the second light-transmissive member 25, the resin materials used for the base material of the resin portion 30 may be used. In particular, a silicone resin composition or an epoxy resin composition is preferable. In the first light-transmissive member 15 or the second light-transmissive member 25, light-scattering particles of, for example, titanium oxide, silicon oxide, zirconium oxide, or aluminum oxide may be dispersed. A resin material used for the base material of the first light-transmissive member 15 and resin material used for the base material of the second light-transmissive member 25 may have different refractive indices.

The first light-transmissive member 15 or the second light-transmissive member 25 may not necessarily contain fluorescent materials, or may contain the second fluorescent material 62. Examples of the second fluorescent material 62 include: $(Ca, Sr, Ba)_5(PO_4)_3(Cl, Br):Eu$; $(Sr, Ca, Ba)_4Al_{14}O_{25}:Eu$; $(Ca, Sr, Ba)_8MgSi_4O_{16}(F, Cl, Br)_2:Eu$; $(Y, Lu, Gd)_3(Al, Ga)_5O_{12}:Ce$; $(Sr, Ca)AlSiN_3:Eu$; $3.5MgO\cdot 0.5MgF_2GeO_2:Mn$; $Ca_3Sc_2Si_3O_{12}:Ce$; $CaSc_2O_4:Ce$; $(La, Y)_3Si_6N_{11}:Ce$; $(Ca, Sr, Ba)_3Si_6O_9N_4:Eu$; $(Ca, Sr, Ba)_3Si_6O_{12}N_2:Eu$; $(Ba, Sr, Ca)Si_2O_2N_2:Eu$; $(Ca, Sr, Ba)_2Si_5N_8:Eu$; $(Ca, Sr, Ba)S:Eu$; $(Ba, Sr, Ca)Ga_2S_4:Eu$; and $K_2(Si, Ti, Ge)F_6:Mn$.

The first light-transmissive member 15 or the second light-transmissive member 25 may be made of an inorganic material such as glass or a sintered body of fluorescent material. This allows for improving reliability of the light-emitting device when the light-emitting device has a high output.

Base Portion

The base portion 5 is disposed under the light-emitting element and serves to reduce the volume of the sealing member 40, which is located over the light-emitting element. The base portion 5 is located under the second light-emitting element 20 in the light-emitting device 100C, but this is not limited thereto. The base portion 5 may be located under the first light-emitting element 10. The base portion 5 may be made of, for example, a material including ceramics such as alumina or aluminum nitride or a resin such as a silicone resin or an epoxy resin. In order to appropriately dissipate heat from the light-emitting element, the base portion 5 preferably has a heat conductivity of 150 W/m·K or more.

Second Embodiment

Figure 5A:
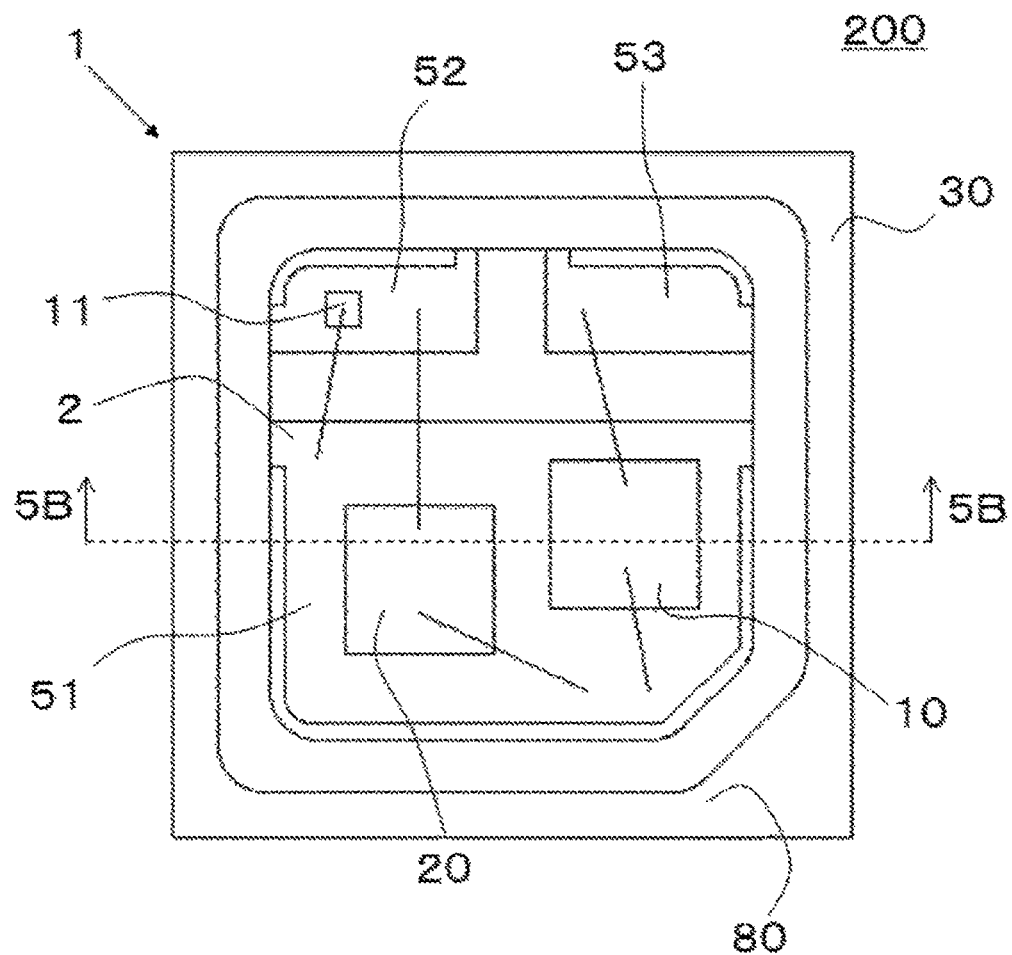
FIG. 5A is a schematic top view of a light-emitting device according to a second embodiment.
Figure 5B:
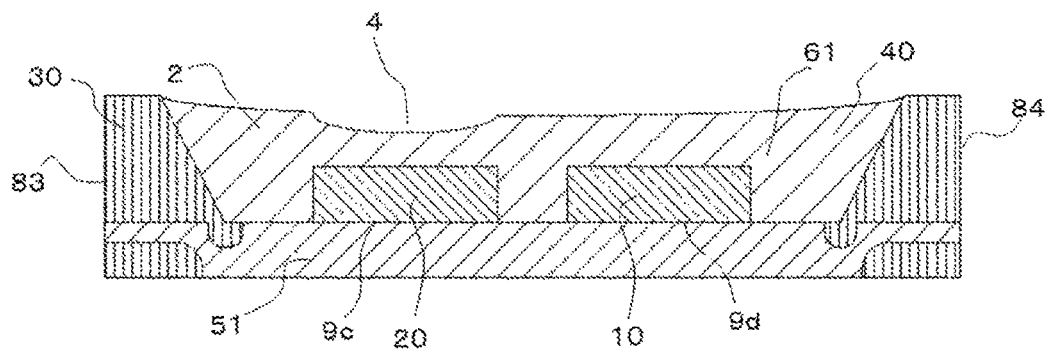
FIG. 5B is a schematic end view taken along the line 5B-5B in FIG. 5A.

FIG. 5A is a schematic top view of a light-emitting device 200 according to a second embodiment, and FIG. 5B is a schematic end view taken along the line 5B-5B in FIG. 5A. Illustration of the sealing member 40 is omitted from FIG. 5A to clearly show the inside of the recess 2. The light-emitting device 200 is different from the light-emitting device 100 according to the first embodiment mainly in that the light-emitting device 200 includes a depressed portion 4 instead of the protruding portion 3. Therefore, description of the light-emitting device 200 will be focused on such differences from the light-emitting device 100.

The light-emitting device 200 includes the first light-emitting element 10, the second light-emitting element 20, and the sealing member 40, which covers the first light-emitting element 10 and the second light-emitting element 20 and contains the first fluorescent material 61. The light-emitting device 200 according to the second embodiment further includes the package 1 having the recess 2, and the first light-emitting element 10 and the second light-emitting element 20 are disposed on the bottom surface of the recess 2.

The sealing member 40 includes a depressed portion 4, which is a portion recessed downward, at a portion of the upper surface. The second light-emitting element 20 is disposed in a first region 9c, which is located under the depressed portion 4. That is, the depressed portion 4 is located directly above the second light-emitting element 20. The first light-emitting element 10 is located under the upper surface of the sealing member 40 and located in a second region 9d, which is at a position different from the first region 9c. In the second embodiment, the "first region" is a region located under the depressed portion 4, and the "second region" is a region other than the first region. With the depressed portion 4 above the second light-emitting element 20, the volume of the sealing member 40 at a portion located above the first light-emitting element 10 can be easily larger than the volume of the sealing member 40 at a portion located above the second light-emitting element 20. This configuration allows an amount of the first fluorescent material 61 at a portion located above the first light-emitting element 10 to be larger than an amount of the first fluorescent material 61 at a portion located above the second light-emitting element 20. Thus, of light emitted toward an area above the sealing member 40, chromaticity of light emitted toward an area above the first light-emitting element 10 can be easily different from chromaticity of light emitted toward an area above the second light-emitting element 20.

For example, in the case of using yellow to red fluorescent materials for the first fluorescent material 61, an x-value of a chromaticity of light emitted toward an area above the first light-emitting element 10 is larger than an x-value of a chromaticity of light emitted toward an area above the second light-emitting element 20. The light-emitting device 200 according to the second embodiment includes the depressed portion 4 above the second light-emitting element 20, therefore, the x-value of the chromaticity of light emitted toward an area above the first light-emitting element 10 can be larger than the x-value of the chromaticity of light emitted toward an area above the second light-emitting element 20. This allows for providing the light-emitting device configured to emit light having a color in a wide chromaticity range.

In a top view, the depressed portion 4 is located at such a position that the centroid of the depressed portion 4 substantially coincides with the center of the second light-emitting element 20. This configuration allows the optical axis of the second light-emitting element 20 to coincide with the optical axis of the depressed portion 4 to efficiently extract light emitted from the second light-emitting element 20 to the outside. In a top view, the entire second light-emitting element 20 may be located under the depressed portion 4 or only a portion of the second light-emitting element 20 may be located under the depressed portion 4. The maximum width of the depressed portion 4 in top view is preferably smaller than the maximum width of the second light-emitting element 20 in top view. This configuration allows for reducing a ratio of returning light, which is light emitted from the second light-emitting element 20 and returns to the second light-emitting element 20 by the surface of the depressed portion 4. Also, a ratio of light that is emitted from the first light-emitting element 10 and enters the depressed portion 4 can be reduced. The maximum width of the depressed portion 4 in a top view is, for example, 0.5 to 0.8 times as large as the maximum width of the second light-emitting element 20 in a top view. The maximum width of the depressed portion 4 in a top view is, for example, 250 µm to 600 µm. A distance between the lowest part and the highest part of the protruding portion 3 in the height direction is, for example, 100 µm to 250 µm.

The depressed portion 4 may be formed simultaneously with the sealing member 40 by molding. Alternatively, a first sealing member may be disposed in the recess 2, and then a portion to become the depressed portion 4 may be subjected to pressing, for example, to form the depressed portion 4 in a different step.

Configurations of the light-emitting device described in each of the first embodiment, the variant examples of the first embodiment, and the second embodiment are suitably applicable to other embodiments. Also, the case where an x-value of a chromaticity of light emitted toward an area above the first light-emitting element 10 is larger than an x-value of a chromaticity of light emitted toward an area above the second light-emitting element 20 is mainly described in the first embodiment, the variant example of the first embodiment, and the second embodiment, but light-emitting devices according to the present disclosure are not limited to this configuration.

What is claimed is:
1. A light-emitting device comprising:
 a first light-emitting element and a second light-emitting element, each having a peak emission wavelength in a range of 430 nm to 480 nm; and a sealing member covering the first light-emitting element and the second light-emitting element, the sealing member containing a first fluorescent material; and a first light-transmissive member disposed at an upper surface of the first light-emitting element and located under the upper surface of the sealing member, the first light-transmissive member containing a second fluorescent material, wherein the first light-emitting element and the second light-emitting element are configured to be individually driven, wherein the sealing member includes a protruding portion at an upper surface thereof, wherein the first light-emitting element is located in a first region that is under the protruding portion, wherein the second light-emitting element is located in a second region that is under the upper surface of the sealing member but that is not under the protruding portion, wherein, in a cross sectional view, the protruding portion of the sealing member has a first vertex and the first light-transmissive member has a second vertex, and the first vertex and the second vertex are positioned on a virtual straight line extending in the vertical direction to the upper surface of the first light-emitting element, wherein lateral surfaces of the first light-emitting element are not covered with the first light-transmissive member, and wherein the lateral surfaces of the first light-emitting element are in direct contact with the sealing member.

2. The light-emitting device according to claim 1, further comprising a second light-transmissive member disposed on an upper surface of the second light-emitting element and located under the upper surface of the sealing member.

3. The light-emitting device according to claim 1, further comprising a base portion disposed under the second light-emitting element.

4. The light-emitting device according to claim 1, further comprising a package having a recess,
wherein the first light-emitting element and the second light-emitting element are disposed at a bottom of the recess.

5. The light-emitting device according to claim 1, wherein the light-emitting device is configured to emit light having a color temperature in a range of 1800 K to 7000 K.

6. The light-emitting device according to claim 1, further comprising a first lead, a second lead, and a third lead,
wherein the first light-emitting element and the second light-emitting element are disposed on an upper surface of the first lead.

7. The light-emitting device according to claim 1, further comprising a first lead, a second lead, a third lead, and a fourth lead,
wherein the first light-emitting element is disposed on an upper surface of the first lead,
the second light-emitting element is disposed on an upper surface of the second lead,
the third lead is electrically connected to an electrode of the first light-emitting element, and
the fourth lead is electrically connected to an electrode of the second light-emitting element.

8. A light-emitting device comprising:
a first light-emitting element and a second light-emitting element, each having a peak emission wavelength in a range of 430 nm to 480 nm; and a sealing member covering the first light-emitting element and the second light-emitting element, the sealing member containing a first fluorescent material; and a first light-transmissive member disposed at an upper surface of the first light-emitting element and located under the upper surface of the sealing member, the first light-transmissive member containing a second fluorescent material, wherein the first light-emitting element and the second light-emitting element are configured to be individually driven, wherein the sealing member includes a depressed portion at a portion of an upper surface thereof, wherein the second light-emitting element is located in a first region that is under the depressed portion, wherein the first light-emitting element is located in a second region that is under the upper surface of the sealing member but that is not under the depressed portion, wherein, in a cross sectional view, the depressed portion of the sealing member has a third vertex and an upper surface of the second light-emitting element has a center, and the third vertex and the center are positioned on a virtual straight line extending in the vertical direction to the upper surface of the second light-emitting element, wherein lateral surfaces of the first light-emitting element are not covered with the first light-transmissive member, and wherein the lateral surfaces of the first light-emitting element are in direct contact with the sealing member.

9. The light-emitting device according to claim 8, further comprising a second light-transmissive member disposed on an upper surface of the second light-emitting element and located under the upper surface of the sealing member.

10. The light-emitting device according to claim 8, further comprising a base portion disposed under the second light-emitting element.

11. The light-emitting device according to claim 8, further comprising a package having a recess,
wherein the first light-emitting element and the second light-emitting element are disposed at a bottom of the recess.

12. The light-emitting device according to claim 8, wherein the light-emitting device is configured to emit light having a color temperature in a range of 1800 K to 7000 K.

13. The light-emitting device according to claim 8, further comprising a first lead, a second lead, and a third lead,
wherein the first light-emitting element and the second light-emitting element are disposed on an upper surface of the first lead.

14. The light-emitting device according to claim 8, further comprising a first lead, a second lead, a third lead, and a fourth lead,
wherein the first light-emitting element is disposed on an upper surface of the first lead,
the second light-emitting element is disposed on an upper surface of the second lead,
the third lead is electrically connected to an electrode of the first light-emitting element, and
the fourth lead is electrically connected to an electrode of the second light-emitting element.

15. The light-emitting device according to claim 11, wherein an uppermost surface of the sealing member is located no higher than an uppermost surface of the package.

16. The light-emitting device according to claim 1, wherein, in a cross sectional view, the upper surface of the first light-emitting element has a center, and the center is positioned on the straight line.

17. The light-emitting device according to claim 1, wherein, in a cross sectional view, a width of the upper surface of the first light-emitting element is the same as an overall width of the first light-transmissive member.

18. The light-emitting device according to claim 8, wherein, in a cross sectional view, a width of the upper surface of the first light-emitting element is the same as an overall width of the first light-transmissive member.

* * * * *